United States Patent
Ishita

(10) Patent No.: US 11,761,113 B2
(45) Date of Patent: Sep. 19, 2023

(54) SIC SINGLE CRYSTAL MANUFACTURING APPARATUS

(71) Applicant: SHOWA DENKO K.K., Tokyo (JP)

(72) Inventor: Kotaro Ishita, Chichibu (JP)

(73) Assignee: Resonac Corporation, Tokyo (JP)

( * ) Notice: Subject to any disclaimer, the term of this patent is extended or adjusted under 35 U.S.C. 154(b) by 308 days.

(21) Appl. No.: 16/558,643

(22) Filed: Sep. 3, 2019

(65) Prior Publication Data

US 2020/0080227 A1 Mar. 12, 2020

(30) Foreign Application Priority Data

Sep. 6, 2018 (JP) .................................. 2018-167066

(51) Int. Cl.
| | | |
|---|---|---|
| *C30B 23/00* | (2006.01) | |
| *C30B 23/06* | (2006.01) | |
| *C30B 29/36* | (2006.01) | |
| *C23C 14/54* | (2006.01) | |
| *C23C 14/26* | (2006.01) | |

(Continued)

(52) U.S. Cl.
CPC ........ *C30B 23/002* (2013.01); *C23C 14/0635* (2013.01); *C23C 14/243* (2013.01); *C23C 14/26* (2013.01); *C23C 14/541* (2013.01); *C30B 23/06* (2013.01); *C30B 29/36* (2013.01)

(58) Field of Classification Search
CPC ... C23C 14/0635; C23C 14/243; C23C 14/26; C23C 14/541; C30B 23/002; C30B 23/06; C30B 29/36
See application file for complete search history.

(56) References Cited

U.S. PATENT DOCUMENTS

2008/0035632 A1* 2/2008 Fujita .................. C23C 16/4581
219/634
2012/0107218 A1 5/2012 Nishiguchi
(Continued)

FOREIGN PATENT DOCUMENTS

| CN | 103374749 A | 10/2013 |
| CN | 205711044 U | 11/2016 |

(Continued)

OTHER PUBLICATIONS

Communication dated Dec. 28, 2020 by the China National Intellectual Property Administration in application No. 201910822530.7.

(Continued)

*Primary Examiner* — Hua Qi
(74) *Attorney, Agent, or Firm* — Sughrue Mion, PLLC

(57) ABSTRACT

The present invention provides a SiC single crystal manufacturing apparatus, including a crystal growth vessel which has a source loading portion to hold a SiC source, and a lid which is provided with a seed crystal support to hold a seed crystal; an insulating material which has at least one through-hole and covers the crystal growth vessel; a heater which is configured to heat the crystal growth vessel; and a temperature measuring instrument which is configured to measure the temperature of the crystal growth vessel through the through-hole, wherein the inner wall surface of the through-hole of the insulating material is coated with a coating material which contains a heat-resistant metal carbide or a heat-resistant metal nitride.

18 Claims, 4 Drawing Sheets

(51) Int. Cl.
  *C23C 14/24* (2006.01)
  *C23C 14/06* (2006.01)

(56) References Cited

U.S. PATENT DOCUMENTS

| | | | | |
|---|---|---|---|---|
| 2012/0152166 A1* | 6/2012 | Tokuda | ................... | C30B 29/36 |
| | | | | 117/200 |
| 2014/0216330 A1* | 8/2014 | Shin | ................. | C30B 23/00 |
| | | | | 118/722 |
| 2017/0204532 A1* | 7/2017 | Land | ................. | C04B 35/56 |

FOREIGN PATENT DOCUMENTS

| | | | | | |
|---|---|---|---|---|---|
| CN | 206244926 U | | 6/2017 | | |
| JP | 2011-178621 A | | 9/2011 | | |
| JP | 2012-126612 A | | 7/2012 | | |
| JP | 2012-206875 A | | 10/2012 | | |
| JP | 5423709 B2 | | 2/2014 | | |
| JP | 2015127267 A | * | 7/2015 | ............. | C30B 23/02 |
| JP | 2015-166298 A | | 9/2015 | | |
| JP | 2015166298 A | * | 9/2015 | | |
| JP | 2017-154953 A | | 9/2017 | | |

OTHER PUBLICATIONS

Notice of Reasons for Rejection dated May 17, 2022 from the Japanese Patent Office in Japanese Application No. 2018-167066.

* cited by examiner

SIC SINGLE CRYSTAL MANUFACTURING APPARATUS

BACKGROUND OF THE INVENTION

Field of the Invention

The present invention relates to a SiC single crystal manufacturing apparatus.

Priority is claimed on Japanese Patent Application No. 2018-167066, filed on Sep. 6, 2018, the content of which is incorporated herein by reference.

Description of Related Art

Silicon carbide (SiC) has a dielectric breakdown field that is greater by one digit and a band gap three times larger, compared to silicon (Si). Furthermore, silicon carbide (SiC) has characteristics such as a thermal conductivity about three times higher than that of silicon (Si). Silicon carbide (SiC) is expected to be applied to power devices, high-frequency devices, high-temperature operation devices, and the like. Therefore, in recent years, SiC epitaxial wafers have been used in semiconductor devices such as described above.

A SiC epitaxial wafer is produced by growing a SiC epitaxial film that serves as an active region for a SiC semiconductor device, on a SiC single crystal substrate using Chemical Vapor Deposition (CVD) method.

A SiC single crystal substrate is produced by cutting a SiC single crystal. As one of methods for producing this SiC single crystal, a sublimation method is widely known. The sublimation method is a method of growing a seed crystal into a larger SiC single crystal. In the sublimation method, generally, a crystal growth vessel (crucible) having a source loading portion that holds a SiC source; and a lid which is provided with a seed crystal support that supports a seed crystal, is used. By heating this crystal growth vessel, thereby sublimating a SiC source, and supplying the sublimation gas thus produced to a seed crystal, the seed crystal is grown into a SiC single crystal. The temperature employed at the time of sublimating a SiC source is usually a high temperature of 2,000° C. or higher. In order to suppress diffusion of heat in this crystal growth vessel and to maintain the temperature inside the vessel constant, the crystal growth vessel is covered with an insulating material. As the insulating material, carbon fiber felt obtained by three-dimensionally orienting carbon fibers is generally utilized.

In order to produce a large-sized high-quality SiC single crystal using a sublimation method, it is necessary to manage temperature such that the internal temperature of the crystal growth vessel is included in an appropriate range. Therefore, a through-hole for temperature measurement (temperature measuring hole) is provided in the thickness direction of the insulating material, and the temperature of the crystal growth vessel is measured using a radiation thermometer.

However, there are occasions in which the through-hole provided in the insulating material is blocked during the production of SiC single crystals. That is, there are occasions in which sublimation gas leaks from the crystal growth vessel to the outside, and the leaked sublimation gas comes into contact with the inner wall surface of the through-hole of the insulating material and is cooled. Due to this cooling, SiC may deposit and block the through-hole. Particularly, when carbon fiber felt, that is generally used as an insulating material, is used for such an insulating material, carbon fibers are exposed on the inner wall surface of the through-hole, and consequently, surface unevenness increases. Therefore, SiC tends to deposit easily.

In order to suppress blocking of the through-hole caused by deposition of SiC, it is disclosed in Patent document 1 that on the inner periphery of a through-hole for temperature measurement of an insulating material, a polished inner wall having a higher bulk density than other parts of the insulating material is formed. In this Patent document 1, graphite is described as an example of the material for the inner wall.

It is disclosed in Patent document 2 that a cylindrical member made of graphite is disposed in the through-hole of the insulating material.

CITATION LIST

Patent Documents

Patent document 1: Japanese Unexamined Patent Application, First Publication (JP-A) No. 2012-206875
Patent document 2: Japanese Unexamined Patent Application, First Publication (JP-A) No. 2017-154953

SUMMARY OF THE INVENTION

Technical Problem

In order to suppress deposition of SiC on the inner wall surface of the through-hole of the insulating material, coating the inner wall surface of the through-hole with a coating material and suppressing exposure of carbon fibers is a useful method. However, according to an investigation of the inventors of the present invention, it was found that when the inner wall surface of the through-hole of the insulating material is coated with graphite as described in Patent documents 1 and 2, SiC is likely to deposit on the inner wall surface of the through-hole as time elapses.

The present invention was made in view of the problems described above, and it is an object of the invention to provide a SiC single crystal manufacturing apparatus, in which deposition of SiC on the inner wall surface of a through-hole of an insulating material is suppressed, and the internal temperature of a crystal growth vessel can be stably managed over a long period of time.

Solution to Problem

The present inventors found that the problems described above can be solved by coating the inner wall surface of a through-hole of an insulating material with a coating material containing a heat-resistant metal carbide or a heat-resistant metal nitride.

That is, the present invention provides the following means in order to solve the problems described above.

(1) A SiC single crystal manufacturing apparatus according to an embodiment of the present invention comprises: a crystal growth vessel which has a source loading portion to hold a SiC source, and a lid which is provided with a seed crystal support to hold a seed crystal; an insulating material which has at least one through-hole and covers the crystal growth vessel; a heater which is configured to heat the crystal growth vessel; and a temperature measuring instrument which is configured to measure the temperature of the crystal growth vessel through the through-hole, wherein the inner wall surface of the through-hole of the insulating material is covered with a coating material which contains a heat-resistant metal carbide or a heat-resistant metal nitride.

(2) With regard to the SiC single crystal manufacturing apparatus according to the above-described embodiment, the heat-resistant metal carbide or heat-resistant metal nitride may be composed of a carbide or a nitride of at least one metal selected from the group consisting of tantalum, molybdenum, hafnium, niobium, titanium, zirconium, tungsten, and vanadium.

Advantageous Effects of Invention

According to the invention, a SiC single crystal manufacturing apparatus can be provided in which deposition of SiC on the inner wall surface of a through-hole of an insulating material is suppressed, and the internal temperature of the crystal growth vessel can be stably managed over a long period of time.

DETAILED DESCRIPTION OF THE INVENTION

Hereinafter, the invention will be described in detail with appropriate reference to the drawings. The drawings used in the following explanation may show magnifications of featured parts for convenience in order to assist easy understanding of the features of the invention, and the dimensions, ratios and the like of the respective constituent elements may be different from the actual values. The materials, dimensions, and the like in the following explanation are only exemplary examples, and the invention is not intended to be limited to those and can be carried out in an appropriately modified manner to the extent that provides the effects of the invention. For example, without being particularly limited, the shape, size, distance, position, and the like can be modified, added, or omitted as necessary.

First Embodiment

Figure 1:
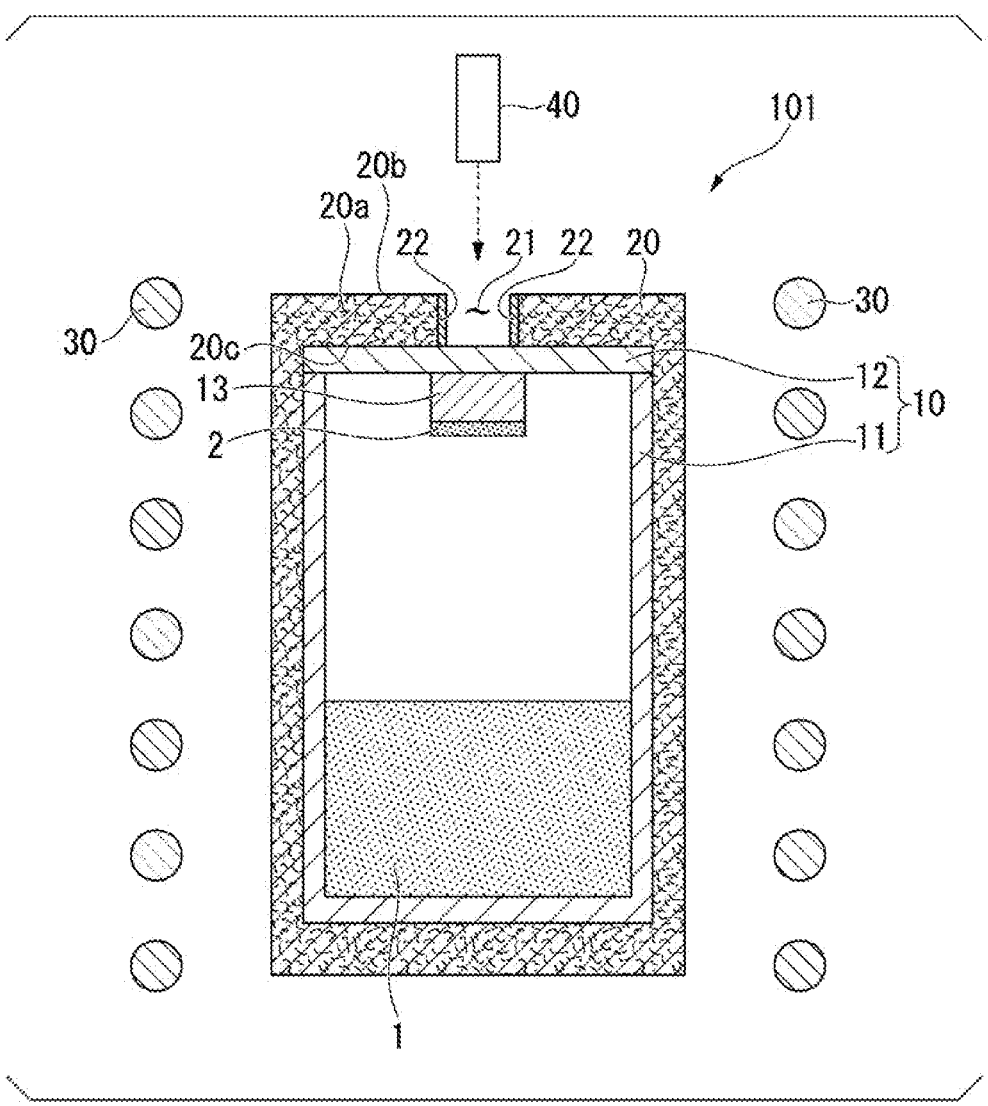
FIG. 1 is a schematic cross-sectional view showing a preferable example of a SiC single crystal growing apparatus according to a first embodiment of the invention.

FIG. 1 is a schematic cross-sectional view showing an example of a SiC single crystal growing apparatus according to a first embodiment of the invention.

The SiC single crystal growing apparatus 101 shown in FIG. 1 comprises a crystal growth vessel 10; an insulating material 20; a heater 30; and a temperature measuring instrument 40.

The crystal growth vessel 10 has a source loading portion 11 and a lid 12. The source loading portion 11 holds a SiC source 1. At the lid 12, a seed crystal support 13 for supporting a seed crystal 2 is disposed. The materials for the source loading portion 11 and the lid 12 can be arbitrarily selected; and, for example, graphite, tantalum carbide, or the like can be used.

The insulating material 20 is disposed around the crystal growth vessel 10 so as to cover the crystal growth vessel 10. It is preferable that the entire crystal growth vessel 10 is covered; however, a site that is not covered may be provided as necessary. In the insulating material 20, a through-hole 21 is formed at the top part 20a that covers the lid 12. A part of the upper face of the lid 12 is exposed from the through-hole 21. The insulating material 20 is not particularly limited, and a known insulating material that is being utilized as an insulating material for a SiC single crystal manufacturing apparatus, such as carbon fiber felt, can be used. In the present example, the position of the through-hole 21 is disposed at a position that overlaps with the seed crystal support 13 as viewed in a plan view; however, the position is not limited to this position only.

The inner wall surface of the through-hole 21 of the insulating material 20 is coated with a coating material 22 containing a heat-resistant metal carbide or a heat-resistant metal nitride. The inner wall may be coated with the coating material which is formed of the heat-resistant metal carbide or the heat-resistant metal nitride. The heat-resistant metal carbide or heat-resistant metal nitride is preferably a substance that has a melting point or a decomposition temperature of 1,900° C. or more and lacks reactivity with the sublimation gas (mainly Si, $Si_2C$, and $SiC_2$). It is thought that in a case in which the inner wall surface of the through-hole has been coated with a coating material containing graphite, deposition such as follows is likely to occur. That is, it is thought that as the inner wall surface (graphite) of the through-hole comes into contact with sublimation gas leaked to the outside, a reaction proceeds, causing the inner wall surface to be partially decomposed, thereby surface unevenness is formed on the inner wall surface, and SiC is likely to deposit on the surface unevenness as starting points. In contrast, in a case in which the inner wall surface has been coated with a coating material 22 containing the above-described heat-resistant metal carbide or heat-resistant metal nitride, a reaction does not easily occur even when the inner wall surface of the through-hole 21 comes into contact with sublimation gas. As a result, surface unevenness is not easily formed on the inner wall surface. Accordingly, SiC is not likely to deposit on the inner wall surface of the through-hole 21 over a long period of time.

It is preferable that the heat-resistant metal carbide and heat-resistant metal nitride is a carbide or nitride of at least one metal selected from the group consisting of titanium (Ti), vanadium (V), zirconium (Zr), niobium (Nb), molybdenum (Mo), hafnium (Hf), tantalum (Ta), and tungsten (W). Ti, Zr, and Hf are elements of Group 4; V, Nb, and Ta are elements of Group 5; and Mo and W are elements of Group 6. These elements of Group 4 to Group 6 have high melting points, and carbides or nitrides thereof are highly heat-resistant and chemically stable. Therefore, by using carbides or nitrides of these elements of Group 4 to Group 6 as the materials for the coating material 22, surface unevenness is not easily produced in the coating material 22 even if the coating material comes into contact with sublimation gas.

Regarding a method of forming the coating material 22 on the inner wall surface of the through-hole 21, for example, a vapor deposition method, a sputtering method, a chemical vapor deposition (CVD) method, or a chemical vapor reaction (CVR) method can be used. Furthermore, regarding a method of forming the coating material 22, a method of forming a thin film of the above-described metal on the inner wall surface of the through-hole 21, and then converting the metal thin film into a carbide or a nitride, can be used. The thickness of the coating material 22 is not particularly limited; however, the thickness is generally in the range of from 0.01 mm to 5 mm. The thickness of the coating material is more preferably from 0.02 to 1.00 mm, and still more preferably from 0.03 to 0.50 mm. However, the thickness is not limited to the examples only.

The heater 30 can be arbitrarily selected without any particular limitations, and any known heater that is utilized as a heater for the SiC single crystal manufacturing apparatus, such as a resistance heater or an induction heater, can be used. Meanwhile, the heater 30 shown in FIG. 1 is an induction heater using a high-frequency coil.

The temperature measuring instrument 40 is a non-contact type temperature measuring instrument that measures the temperature of the lid 12 through the through-hole 21. Regarding the temperature measuring instrument 40, a radiation thermometer can be used.

In the SiC single crystal growing apparatus 101 of the present embodiment, the crystal growth vessel 10 is heated by the heater 30. Through this heating, the SiC source 1 held in the source loading portion 11 of the crystal growth vessel 10 sublimates, and therefore sublimation gas is produced. The sublimation gas comes into contact with a seed crystal 2 that is held by the seed crystal support 13 of the lid 12 and grows the seed crystal 2 into a SiC single crystal.

On the other hand, the sublimation gas flowing out from the crystal growth vessel 10 passes through the through-hole 21 of the insulating material 20, via between the crystal growth vessel 10 and the insulating material 20. In the SiC single crystal growing apparatus 101 of the present embodiment, since the inner wall surface of the through-hole 21 is coated with the coating material 22, even if the sublimation gas comes into contact with the inner wall surface (coating material 22) of the through-hole 21, a reaction is not likely to occur. Therefore, the inner wall surface (coating material 22) of the through-hole 21 is maintained in a highly smooth state over a long period of time, and blocking by deposition of SiC does not easily occur. Therefore, the temperature of the lid 12 of the crystal growth vessel 10 can be stably measured over a long period of time using a temperature measuring instrument 40, and from this, the internal temperature of the crystal growth vessel 10 can be stably managed over a long period of time.

When the SiC single crystal growing apparatus 101 of the present embodiment is used, the internal temperature of the crystal growth vessel 10 can be stably managed over a long period of time, and therefore it is possible to produce a large-sized high-quality SiC single crystal.

Second Embodiment

Figure 2:
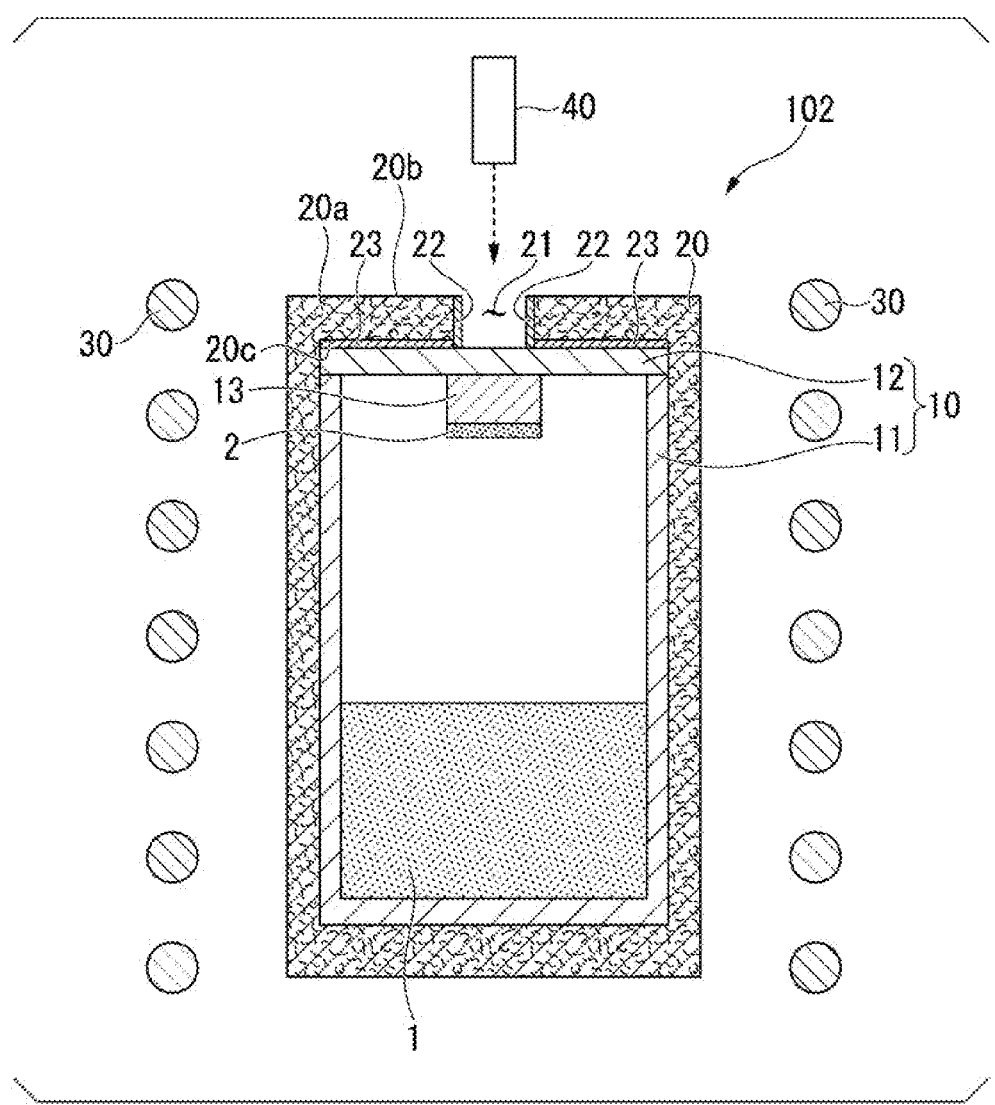
FIG. 2 is a schematic cross-sectional view showing a preferable example of a SiC single crystal growing apparatus according to a second embodiment of the invention.

FIG. 2 is a schematic cross-sectional view of a SiC single crystal growing apparatus according to a second embodiment of the present invention.

The SiC single crystal growing apparatus 102 shown in FIG. 2 is different from the SiC single crystal growing apparatus 101 according to the first embodiment, from the viewpoint that a surface of the top part 20a of the insulating material 20, the surface being on the crystal growth vessel 10 side (surface on the inner side 20c), is coated with a coating material 23. Meanwhile, commonly shared parts between the SiC single crystal growing apparatus 102 according to the present embodiment and the SiC single crystal growing apparatus 101 according to the first embodiment will be assigned with same reference symbols, and further description will not be provided here.

It is preferable that the coating material 23 is formed from the same material as the coating material 22. However, when the coating material 22 and the coating material 23 are formed of a material which includes the heat-resistant metal carbide or the heat-resistant metal nitride described above, the two coating materials may differ from each other. It is preferable that the coating material 23 is connected with the coating material 22.

When the SiC single crystal growing apparatus 102 of the present embodiment is used, SiC does not easily deposit on the inner surface of the top part 20a of the insulating material 20. Therefore, SiC is prevented from growing from the SiC, which is deposited on the inner surface of the insulating material 20, as a starting point and thereby blocking the through-hole 21.

Third Embodiment

Figure 3:
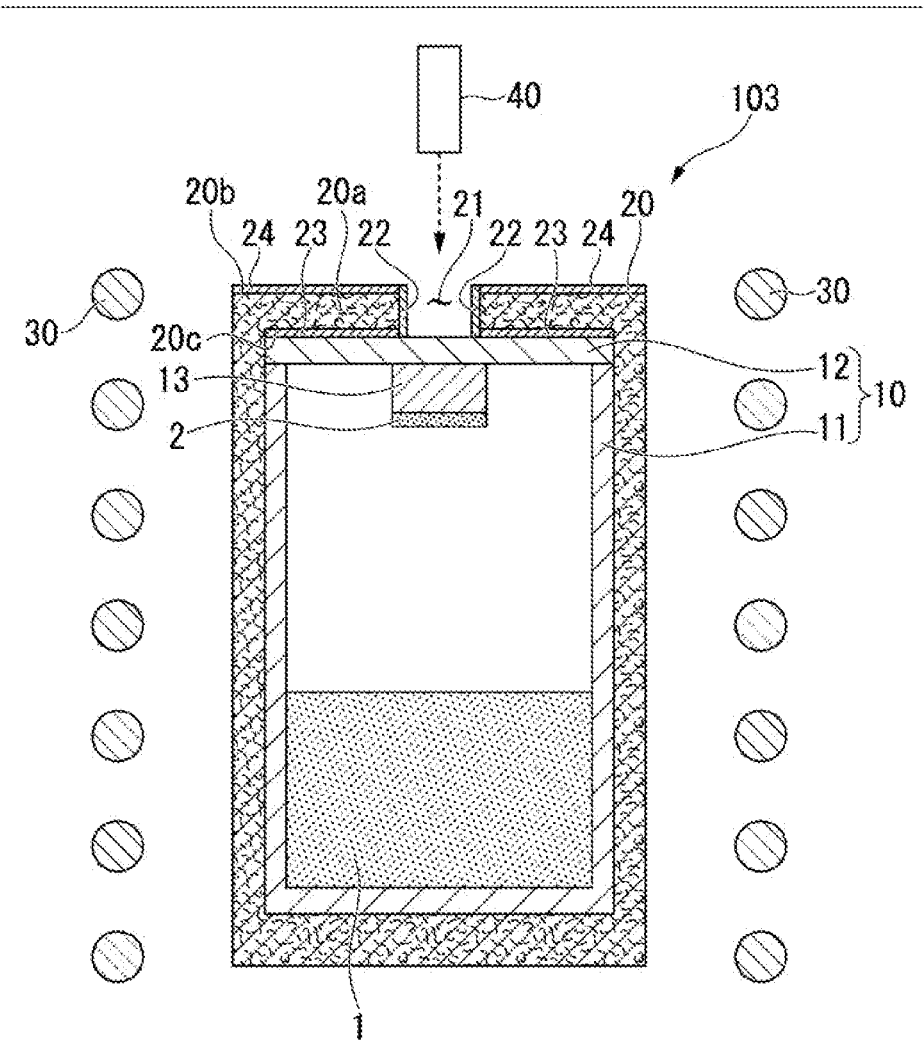
FIG. 3 is a schematic cross-sectional view showing a preferable example of a SiC single crystal growing apparatus according to a third embodiment of the invention.

FIG. 3 is a schematic cross-sectional view of a SiC single crystal growing apparatus according to a third embodiment of the invention.

The SiC single crystal growing apparatus 103 shown in FIG. 3 is different from the SiC single crystal growing apparatus 102 according to the second embodiment, from the viewpoint that a surface of the top part 20a of the insulating material 20, the surface being on the opposite side of the crystal growth vessel 10 side (surface on the outer side 20b), is coated with a coating material 24. Meanwhile, commonly shared parts between the SiC single crystal growing apparatus 103 according to the present embodiment and the SiC single crystal growing apparatus 102 according to the second embodiment will be assigned with same reference symbols, and further description will not be provided here.

It is preferable that the coating material 24 is formed from the same material as the coating material 22 and the coating material 23. However, when the coating material 22, the coating material 23 and the coating material 24 are formed of a material which include the heat-resistant metal carbide or the heat-resistant metal nitride described above, the coating materials may differ from each other. It is preferable that the coating material 24 is connected with the coating material 22 and the coating material 23.

When the SiC single crystal growing apparatus 103 of the present embodiment is used, SiC does not easily deposit on the surface on the outer side 20b of the top part 20a of the insulating material 20. Therefore, SiC is prevented from growing from the SiC, which is deposited on the inner surface of the insulating material 20, as a starting point and thereby blocking the through-hole 21.

Fourth Embodiment

Figure 4:
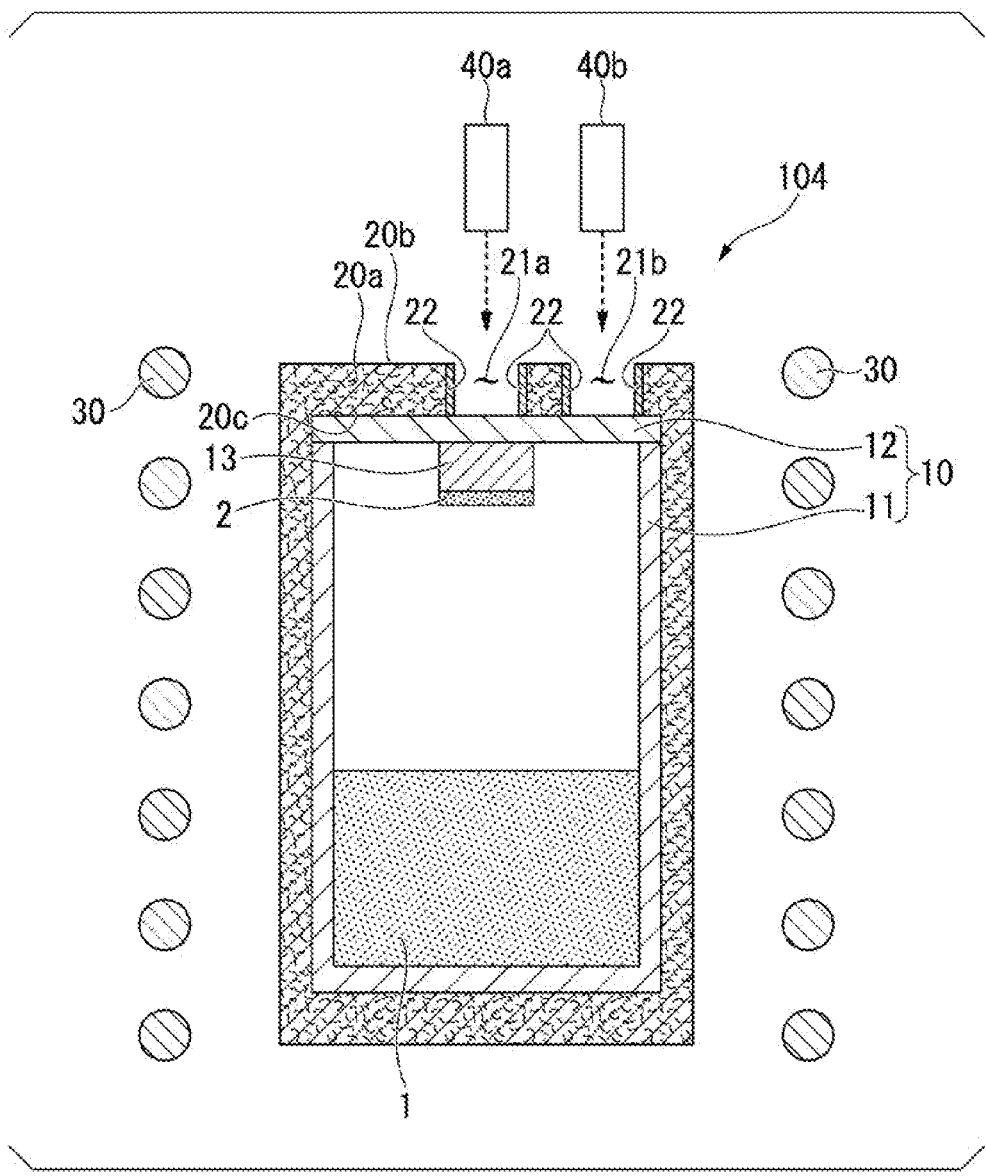
FIG. 4 is a schematic cross-sectional view showing a preferable example of a SiC single crystal growing apparatus according to a fourth embodiment of the invention.

FIG. 4 is a schematic cross-sectional view of a SiC single crystal growing apparatus according to a fourth embodiment of the present invention.

The SiC single crystal growing apparatus 104 shown in FIG. 4 is provided such that two through-holes 21a and 21b are formed at the top part 20a of the insulating material 20, and two temperature measuring instruments 40a and 40b are respectively configured to measure the temperature of the lid 12 of the crystal growth vessel 10 through the through-holes 21a and 21b. The SiC single crystal growing apparatus 104 is different from the SiC single crystal growing apparatus 101 according to the first embodiment from this point of view. Meanwhile, commonly shared parts between the SiC single crystal growing apparatus 104 according to the present embodiment and the SiC single crystal growing apparatus 101 according to the first embodiment will be assigned with same reference symbols, and further description will not be provided here.

When the SiC single crystal growing apparatus 104 of the present embodiment is used, the temperature of the lid 12 of the crystal growth vessel 10 can be measured at two sites, and therefore the distribution of the internal temperature of the crystal growth vessel 10 can be managed. Furthermore, since the two through-holes 21a and 21b are respectively coated with the coating material 22, the distribution of the internal temperature of the crystal growth vessel 10 can be managed stably over a long period of time.

Meanwhile, in the present embodiment, two through-holes 21a and 21b are formed at the top part 20a of the insulating material 20; however, the number of these through-holes is not limited. For example, the number of the through-holes may be set to three or more.

Thus, embodiments of the invention have been described by taking the case of forming a through-hole 21 at the top part 20a of the insulating material 20 as an example; however, the place of formation of the through-hole 21 is not particularly limited. For example, a through-hole 21 may also be formed at the bottom or the lateral side of the insulating material 20.

EXAMPLES

Example 1

An insulating material made of carbon fiber felt was prepared. One through-hole (inner diameter: 30 mm) was formed at the top part of this insulating material, and a coating material (thickness: 0.030 mm) formed from TaC was formed on the inner wall surface of the through-hole. The coating material was formed by a vapor deposition method. A SiC single crystal manufacturing apparatus having the configuration shown in FIG. 1 was produced using this insulating material.

Example 2

A SiC single crystal manufacturing apparatus having the configuration shown in FIG. 2 was produced in the same manner as in Example 1, except that a coating material formed from TaC was formed on the surface on the inner wall surface of the through-hole of the insulating material and on the surface on the inner side of the top part of the insulating material.

Example 3

A SiC single crystal manufacturing apparatus having the configuration shown in FIG. 3 was produced in the same manner as in Example 1, except that a coating material formed from TaC was formed on the surface on the inner wall surface of the through-hole of the insulating material and on the surfaces on the inner side and the outer side of the top part of the insulating material.

Comparative Example 1

A SiC single crystal manufacturing apparatus was produced in the same manner as in Example 1, except that the inner wall surface of the through-hole was not coated with a coating material.

Comparative Example 2

A SiC single crystal manufacturing apparatus was produced in the same manner as in Example 1, except that one through-hole (inner diameter: 40 mm) was formed at the top part of the insulating material, and a coating material (thickness: 5 mm) made of graphite was formed on the inner wall surface of the through-hole. The coating material formed from graphite was formed by applying a graphite paste on the inner wall surface of the through-hole, subsequently drying the graphite paste, and then polishing the graphite surface.

[Evaluation]
(Time for Blocking of Through-Hole of Insulating Material)

While a SiC single crystal was produced by the following manufacturing method, the temperature of the lid was measured through the through-hole using a temperature measuring instrument (pyrometer). The time taken from the initiation of manufacture of the SiC single crystal (initiation of heating by a heater) to the time point when the through-hole was blocked and the temperature of the lid could not be measured with a temperature measuring instrument, was measured as the blocking time.

(Method for Manufacturing SiC Single Crystal)

A SiC source was introduced into the source loading portion of the crystal growth vessel of a SiC single crystal manufacturing apparatus, and a seed crystal was disposed at the seed crystal support of the lid. Next, the power supply of the heater was turned on, and the crystal growth vessel was heated such that the temperature of the lid would be 2,000° C. or higher. Thus, crystal growth was carried out.

TABLE 1

| | Material of coating material | Configuration of SiC single crystal manufacturing apparatus | Thickness of coating material (mm) | Blocking time of through-hole (hour) |
|---|---|---|---|---|
| Example 1 | TaC | FIG. 1 | 0.03 | No blocking (300) |
| Example 2 | TaC | FIG. 2 | 0.03 | No blocking (300) |
| Example 3 | TaC | FIG. 3 | 0.03 | No blocking (300) |
| Comparative Example 1 | None | — | — | 100 |
| Comparative Example 2 | Graphite | FIG. 1 | 5 | 200 |

As shown in Table 1 described above, in Examples 1 to 3 in which a coating material formed from TaC, which is a heat-resistant metal carbide, was formed on the inner wall surface of the through-hole of the insulating material, the through-hole was not blocked even after a lapse of 300 hours from the initiation of manufacture of a SiC single crystal. In contrast, in Comparative Example 1 in which a coating material was not formed on the inner wall surface, the blocking time was 100 hours. Furthermore, in Comparative Example 2 in which a coating material formed from graphite was formed on the inner wall surface, the blocking time was 200 hours, and this was short compared to Examples 1 to 3.

It is considered that the blocking time in Comparative Example 2 was short compared to Examples 1 to 3 because as the inner wall surface (graphite) of the through-hole came into contact with sublimation gas, a reaction proceeded, the inner wall surface was partially decomposed, thereby surface unevenness was formed on the inner wall surface, and SiC deposited on the surface unevenness as starting points. In contrast, in Examples 1 to 3, since the coating material is formed from TaC, which is a heat-resistant metal carbide, and a reaction does not easily occur even if the coating material comes into contact with the sublimation gas, surface unevenness is not likely to be formed on the inner wall surface of the through-hole. Accordingly, it is considered that Examples 1 to 3 had prolonged blocking time.

Furthermore, after the manufacture of a SiC single crystal, the surface on the inner side of the top part of the insulating material was observed, and deposit of SiC on the surface on the inner side of the top part of the insulating material was not observed in the insulating materials of Example 2 and Example 3. From these results, it was confirmed that in Example 2 and Example 3 in particular, deterioration of the insulating material was prevented, and therefore it is possible to stably manufacture a large-sized high-quality SiC single crystal.

INDUSTRIAL APPLICABILITY

A SiC single crystal manufacturing apparatus that can stably manage the internal temperature of the crystal growth vessel over a long period of time can be provided by the present invention.

EXPLANATION OF REFERENCES

1 SiC source
2 Seed crystal
10 Crystal growth vessel
11 Source loading portion
12 Lid
13 Seed crystal support
20 Insulating material
20a Top part
20b Surface on the outer side
20c Surface on the inner side
21, 21a, 21b Through-hole
22 Coating material
23 Coating material
24 Coating material
30 Heater
40, 40a, 40b Temperature measuring instrument
101, 102, 103, 104 SiC single crystal growing apparatus

The invention claimed is:

1. A SiC single crystal manufacturing apparatus, comprising:
a crystal growth vessel which has a source loading portion to hold a SiC source, and a lid which is provided with a seed crystal support to hold a seed crystal;
an insulating material which has at least one through-hole and covers the crystal growth vessel;
a heater which is configured to heat the crystal growth vessel; and
a temperature measuring instrument which is configured to measure a temperature of the crystal growth vessel through the at least one through-hole,
wherein the insulating material has
a top part which has the at least one through-hole and covers the lid of the crystal growth vessel,
a side part which covers a side surface of the source loading portion, and
a bottom part which covers a bottom surface of the source loading portion,
an inner wall surface of the at least one through-hole of the insulating material is coated with a coating material which contains a heat-resistant metal carbide or a heat-resistant metal nitride,
a surface of the top part on an inner side is coated with a coating material containing a heat-resistant metal carbide or a heat-resistant metal nitride, and
a surface of the top part on an outer side is coated with a coating material containing a heat-resistant metal carbide or a heat-resistant metal nitride,
wherein the surface of the top part on the inner side refers to a surface of the top part which faces the crystal growth vessel, and
the surface of the top part on the outer side refers to a surface of the top part which is located on an opposite side to the crystal growth vessel,
a thickness of the coating material on the inner wall surface of the at least one through-hole is in a range of from 0.01 mm to 5 mm,
the side part of the insulating material directly contacts with the side surface of the source loading portion, and
the bottom part of the insulating material directly contacts with the bottom surface of the source loading portion.

2. The SiC single crystal manufacturing apparatus according to claim 1, wherein the heat-resistant metal carbide or the heat-resistant metal nitride is a carbide or a nitride of at least one metal selected from the group consisting of tantalum, molybdenum, hafnium, niobium, titanium, zirconium, tungsten, and vanadium.

3. The SiC single crystal manufacturing apparatus according to claim 2, wherein the inner wall surface of the at least one through-hole of the insulating material is coated with the coating material which consists of the heat-resistant metal carbide or the heat-resistant metal nitride.

4. The SiC single crystal manufacturing apparatus according to claim 1, wherein the insulating material has the two or more through-holes.

5. The SiC single crystal manufacturing apparatus according to claim 1, wherein the at least one through-hole is disposed at a position that overlaps with the seed crystal support in a plan view.

6. The SiC single crystal manufacturing apparatus according to claim 1, wherein the lid is exposed from the at least one through-hole.

7. The SiC single crystal manufacturing apparatus according to claim 1, wherein the coating material on the inner wall surface of the at least one through-hole is formed of tantalum carbide.

8. The SiC single crystal manufacturing apparatus according to claim 1, wherein the coating material on the surface of the top part on the inner side is formed from the same material as the coating material on the inner wall surface of the at least one through-hole.

9. The SiC single crystal manufacturing apparatus according to claim 1, wherein the coating material on the surface of the top part on the inner side is connected with the coating material on the inner wall surface of the at least one through-hole.

10. The SiC single crystal manufacturing apparatus according to claim 1, wherein the coating material on the surface of the top part on the outer side is formed from the same material as the coating material on the inner wall surface of the at least one through-hole and the coating material on the surface of the top part on the inner side.

11. The SiC single crystal manufacturing apparatus according to claim 1, wherein the coating material on the inner wall surface of the at least one through-hole is connected with the coating material on the surface of the top part on the inner side and the coating material on the surface of the top part on the outer side.

12. The SiC single crystal manufacturing apparatus according to claim 1, wherein the inner wall surface of the at least one through-hole is coated with the coating material which consists of the heat-resistant metal carbide.

13. The SiC single crystal manufacturing apparatus according to claim 1, wherein the inner wall surface of the at least one through-hole is coated with the coating material which consists of the heat-resistant metal nitride.

14. The SiC single crystal manufacturing apparatus according to claim 1, wherein
the surface of the top part on the inner side is coated with the coating material which consists of the heat-resistant metal carbide, and
the surface of the top part on the outer side is coated with the coating material which consists of the heat-resistant metal carbide.

15. The SiC single crystal manufacturing apparatus according to claim 1, wherein
the surface of the top part on the inner side is coated with the coating material which consists of the heat-resistant metal nitride, and
the surface of the top part on the outer side is coated with the coating material which consists of the heat-resistant metal nitride.

16. The SiC single crystal manufacturing apparatus according to claim 1, wherein
the lid is located between the source loading portion and the at least one through-hole,
the at least one through-hole is located on the lid, and
the insulating material contacts with an entire outer surface of the crystal growth vessel except for where the at least one through-hole is located.

17. The SiC single crystal manufacturing apparatus according to claim 1, wherein the coating material on the inner wall surface of the at least one through-hole consists of TaC.

18. A SiC single crystal manufacturing apparatus, comprising:
a crystal growth vessel which has a source loading portion to hold a SiC source, and a lid which is provided with a seed crystal support to hold a seed crystal;
an insulating material which has at least one through-hole and covers the crystal growth vessel;
a heater which is configured to heat the crystal growth vessel; and
a temperature measuring instrument which is configured to measure a temperature of the crystal growth vessel through the at least one through-hole,
wherein the insulating material has
a top part which has the at least one through-hole and covers the lid of the crystal growth vessel,
a side part which covers a side surface of the source loading portion, and
a bottom part which covers a bottom surface of the source loading portion,
an inner wall surface of the at least one through-hole of the insulating material is coated with a coating material which contains a heat-resistant metal carbide or a heat-resistant metal nitride,
a surface of the top part on an inner side is coated with a coating material containing a heat-resistant metal carbide or a heat-resistant metal nitride, and
a surface of the top part on an outer side is coated with a coating material containing a heat-resistant metal carbide or a heat-resistant metal nitride,
wherein the surface of the top part on the inner side refers to a surface of the top part which faces the crystal growth vessel, and
the surface of the top part on the outer side refers to a surface of the top part which is located on an opposite side to the crystal growth vessel,
the heat-resistant metal carbide or the heat-resistant metal nitride is a carbide or a nitride of at least one metal selected from the group consisting of tantalum, molybdenum, hafnium, niobium, titanium, zirconium, tungsten, and vanadium,
the side part of the insulating material directly contacts with the side surface of the source loading portion, and
the bottom part of the insulating material directly contacts with the bottom surface of the source loading portion.

* * * * *